United States Patent
Kim

(10) Patent No.: US 7,397,179 B2
(45) Date of Patent: Jul. 8, 2008

(54) FLAT PANEL DISPLAY HAVING REDUCED LINE RESISTANCE

(75) Inventor: Kum-Nam Kim, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 338 days.

(21) Appl. No.: 10/911,482

(22) Filed: Aug. 5, 2004

(65) Prior Publication Data

US 2005/0029937 A1    Feb. 10, 2005

(30) Foreign Application Priority Data

Aug. 6, 2003    (KR) ...................... 10-2003-0054344

(51) Int. Cl.
    *H01J 1/36*    (2006.01)
(52) U.S. Cl. .................... 313/506; 313/505; 313/5; 313/308
(58) Field of Classification Search ......... 313/506–509, 313/308, 5, 505; 315/169.3; 345/92
    See application file for complete search history.

(56) References Cited

U.S. PATENT DOCUMENTS 5,831,709 A * 11/1998 Song ........................... 349/149
6,522,079 B1 * 2/2003 Yamada .................... 315/169.3
6,633,270 B2 * 10/2003 Hashimoto ................... 345/76
6,690,110 B1    2/2004 Yamada et al.
6,867,541 B2 * 3/2005 Okuyama et al. ........... 313/506
6,911,960 B1    6/2005 Yokoyama

FOREIGN PATENT DOCUMENTS

| JP | 2000-173779 | 6/2000 |
| JP | 2001-109395 | 4/2001 |
| KR | 2003-0058764 | 7/2003 |
| KR | 2003-0064332 | 7/2003 |

* cited by examiner

*Primary Examiner*—Peter Macchiarolo
(74) *Attorney, Agent, or Firm*—H.C. Park & Associates, PLC.

(57) ABSTRACT

A flat panel display reduces the line resistance of a driving power supply line and prevents a voltage drop in the driving power supply line so as to obtain uniform resolution and luminance. The flat panel display includes a substrate, a display region formed on the substrate, the display region having a self-luminescent element and VDD lines that supply a driving potential power and/or a source current to the self-luminescent element. Further, a covering member for sealing the display region at least, the covering member being adhered to the substrate to face the substrate and a terminal region formed on one or more edges of the substrate, the terminal region having one or more driving power terminals are provided. In addition, a driving power supply line that connects the driving power terminals to the VDD lines of the display region and a bus conductive unit that is electrically connected to the driving power supply line are provided.

4 Claims, 7 Drawing Sheets

FLAT PANEL DISPLAY HAVING REDUCED LINE RESISTANCE

CROSS REFERENCE TO RELATED APPLICATIONS

This application claims the priority of Korean Patent Application No. 2003-54344, filed on Aug. 6, 2003, in the Korean Intellectual Property Office, the disclosure of which is incorporated herein by reference in its entirety.

1. Field of the Invention

The present invention relates to a flat panel display, and more particularly, to a flat panel display with a wide display region.

2. Background of the Invention

Flat panel displays, such as liquid crystal displays (LCDs) or organic or inorganic electro-luminescent (EL) displays, may be categorized as either a passive matrix (PM) type or an active matrix (AM) type, according to the driving method. In a PM type flat panel display, a plurality of anodes and cathodes are arranged in columns and rows, respectively, and a scan signal is transmitted from a row driving circuit to one cathode selected from a row. A data signal is input to each pixel of a column driving circuit.

An AM type flat panel display may be used as a device for displaying moving pictures since it may be suitable for processing of a great number of signals by controlling a signal input to each pixel using a thin film transistor (hereinafter, referred to as a TFT).

An organic EL display has an organic luminescent layer between an anode and a cathode. In the organic EL display, as an anode voltage and a cathode voltage are applied to the anode and the cathode, respectively, holes introduced from the anode are transported to the luminescent layer via a hole transport layer, and electrons introduced from the cathode are transported to the luminescent layer via an electron transport layer. In the luminescent layer, the electrons and the holes are combined to produce excitons. As the excited state of the excitons is changed to a ground state, fluorescent molecules of the luminescent layer emit light to form an image. Pixels emitting three colors, namely, red (R), green (G), and blue (B), are included in a full-color organic EL display to achieve a full-color display.

AM-type organic EL displays are disclosed in Japan Patent Publication No. 2000-173779 and Japan Patent Publication No. 2001-109395. In each of the displays, an additional contact portion is formed under a cathode deposited on the entire display region in order to prevent reductions in line resistance and contact resistance of the cathode. The contact portion is located between a power supply line and the cathode and formed of the same material as an anode, i.e., Indium Tin Oxide (ITO).

However, these conventional AM-type organic EL displays do not consider increases in a line resistance of a driving power supply line connected to a VDD. In an AM-type organic EL display, if a lengthy driving power supply line is installed, the line resistance increases and causes a voltage drop. As a result, the AM-type organic EL display may have a non-uniform resolution. The driving power supply line applies a current that varies according to the size of an image. As the current varies, a voltage is divided between the line resistance in a region ranging from a terminal region to a display region including pixels and the display region resistance. Thus, achieving uniform luminance may be difficult.

SUMMARY OF THE INVENTION

An exemplary embodiment of the present invention provides a flat panel display, which reduces a line resistance of a driving power supply line.

An exemplary embodiment of the present invention also provides a flat panel display, which prevents a voltage drop in a driving power supply line so as to obtain more uniform resolution and luminance.

According to an exemplary aspect of the present invention, a flat panel display comprises a substrate and a display region formed on the substrate. The display region has a self-luminescent element and VDD lines that supply a driving potential power and/or a source current to the self-luminescent element. A covering member seals at least the display region and is adhered to the substrate to face the substrate. A terminal region is formed on one or more edges of the substrate and has one or more driving power terminals. A driving power supply line connects the driving power terminals to the VDD lines of the display region, and a bus conductive unit is electrically connected to the driving power supply line.

The driving power supply line may be electrically coupled to the bus conductive unit by one or more contact portions that are formed along the driving power supply line. The contact portions may include one or more contact holes, each of which is formed in an insulating layer located in an upper portion of the driving power supply line. The one or more contact holes expose a portion of the driving power supply line, and the driving power supply line may be electrically coupled to the bus conductive unit via the contact holes. The driving power supply line may be electrically coupled to the bus conductive unit by a conductive paste that is applied to the contact holes.

BRIEF DESCRIPTION OF THE DRAWINGS

The above object and advantages of the present invention will become more apparent by describing in detail exemplary embodiments thereof with reference to the attached drawings.

DETAILED DESCRIPTION OF THE INVENTION

Figure 1:
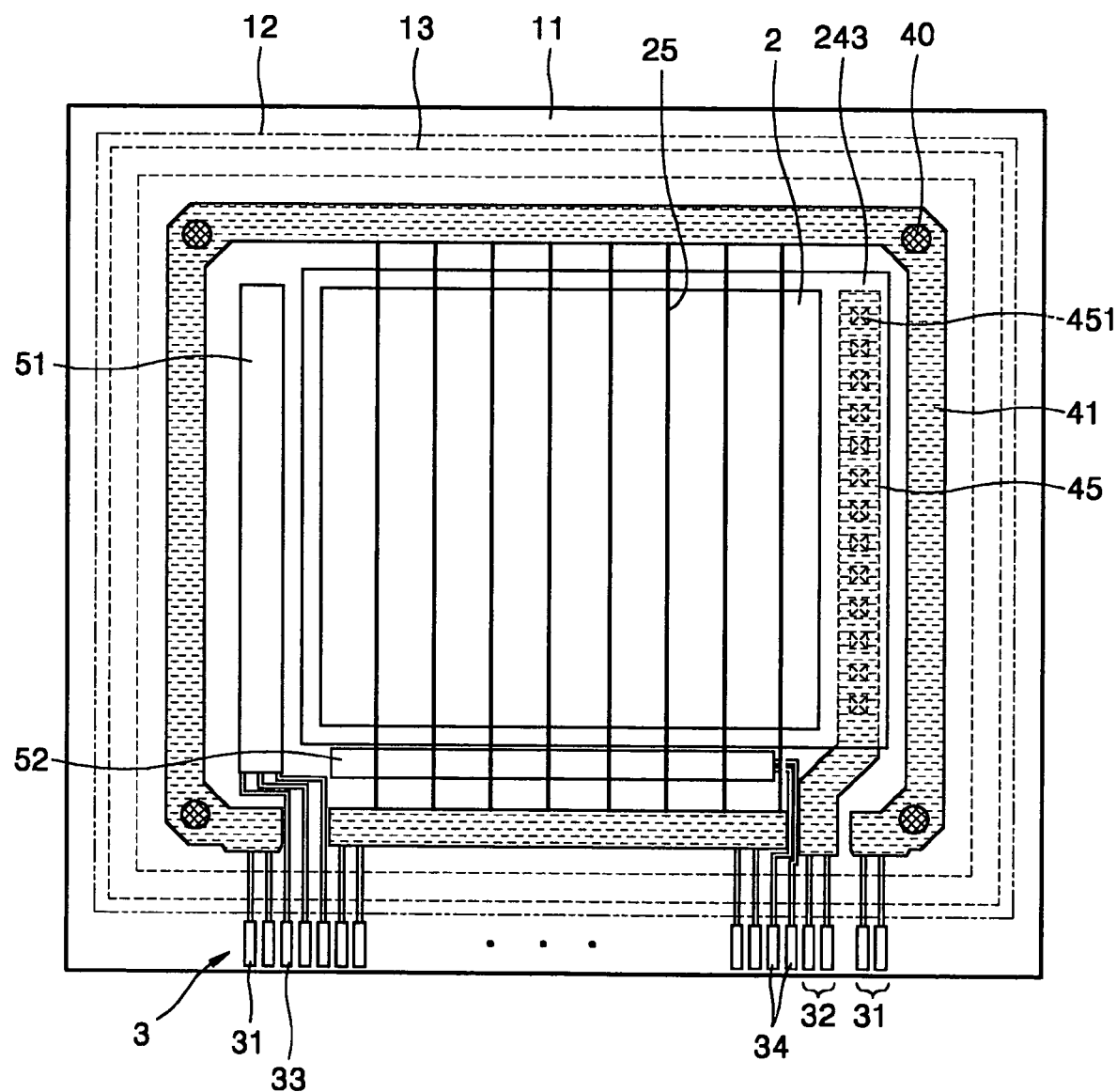
FIG. 1 is a plan view of an AM-type organic EL display according to an exemplary embodiment of the present invention.

Referring to FIG. 1, an AM-type EL display comprises a plurality of sub-pixels in a display region 2. Initially, the sub-pixels will be described with reference to FIGS. 7 through 10. However, the present invention is not limited to the structure of the sub-pixels shown in FIGS. 7 through 10.

Figure 7:
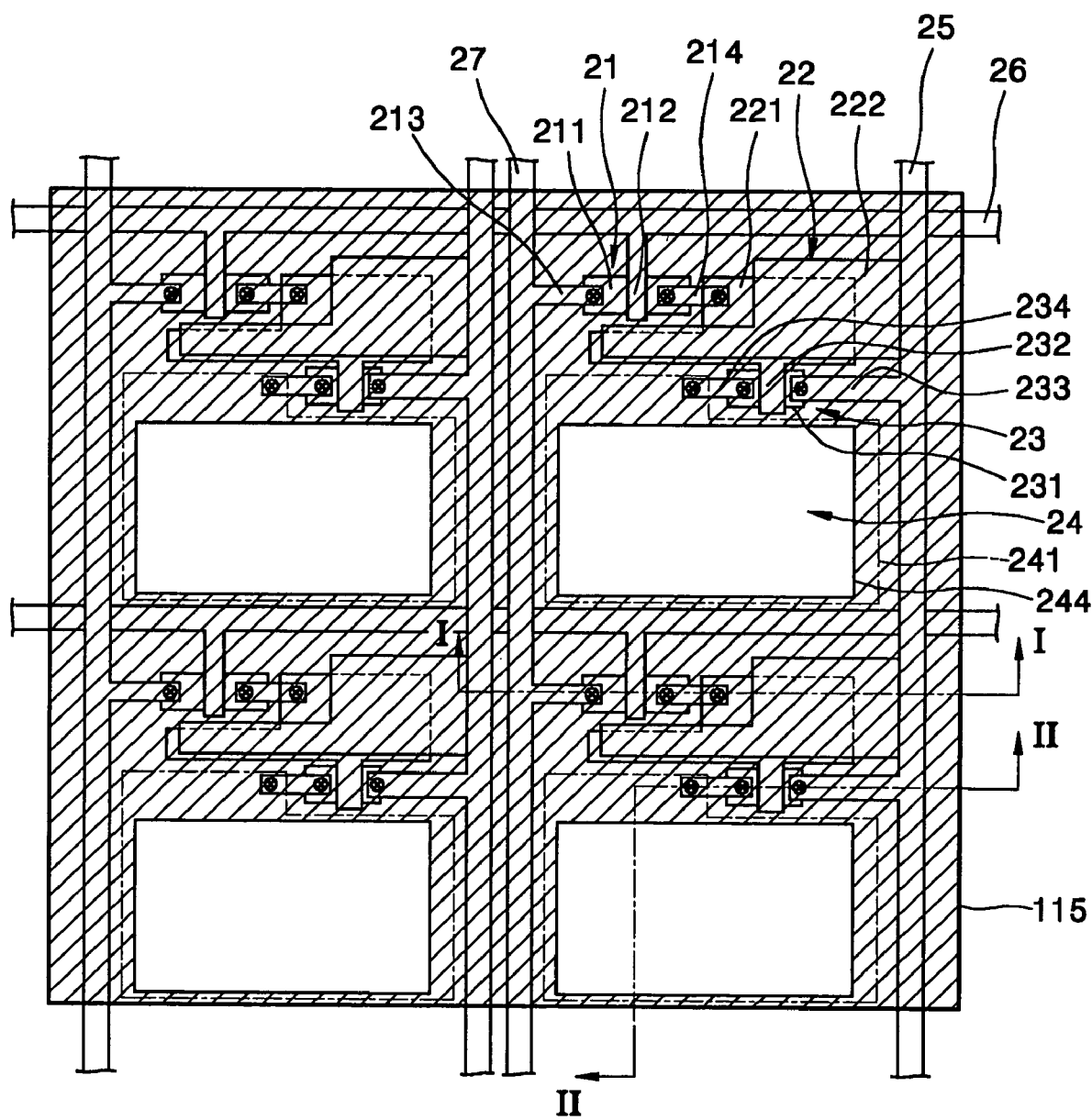
FIG. 7 is a partially magnified plan view of four adjacent sub-pixels of FIG. 1.
Figure 8:
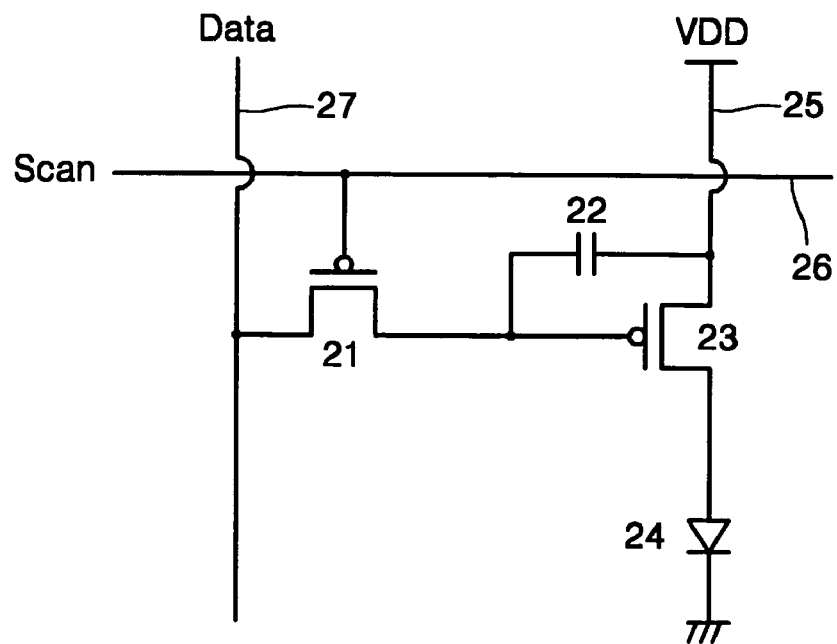
FIG. 8 is an equivalent circuit diagram of a unit sub-pixel of FIG. 1.

FIG. 7 is a partially magnified plan view of four adjacent sub-pixels selected among the sub-pixels of FIG. 1, and FIG. 8 is an equivalent circuit diagram of each of the sub-pixels of FIG. 7.

Referring to FIG. 8, each of the sub-pixels of the AM-type organic EL display comprises at least two TFTs, of which a first TFT 21 may be for switching and a second TFT 23 may be for driving. The EL display further comprises a capacitor 22, and an organic EL display (hereinafter, referred to as an EL display) 24. A greater number of TFTs and capacitors than the two TFTs and one capacitor illustrated in FIG. 8 may be included, depending on the design specification.

The first TFT 21 is driven in response to a scan signal applied to a gate line 26 and transmits a data signal, applied to a data line 27, to the capacitor 22 and the second TFT 23. The second TFT 23 determines the amount of current flowing into the EL display 24, according to the data signal received through the first TFT 21, that is, a voltage difference Vgs between a gate and a source. The capacitor 22 stores the data signal received through the first TFT 21, for a period of one frame.

Figure 9:
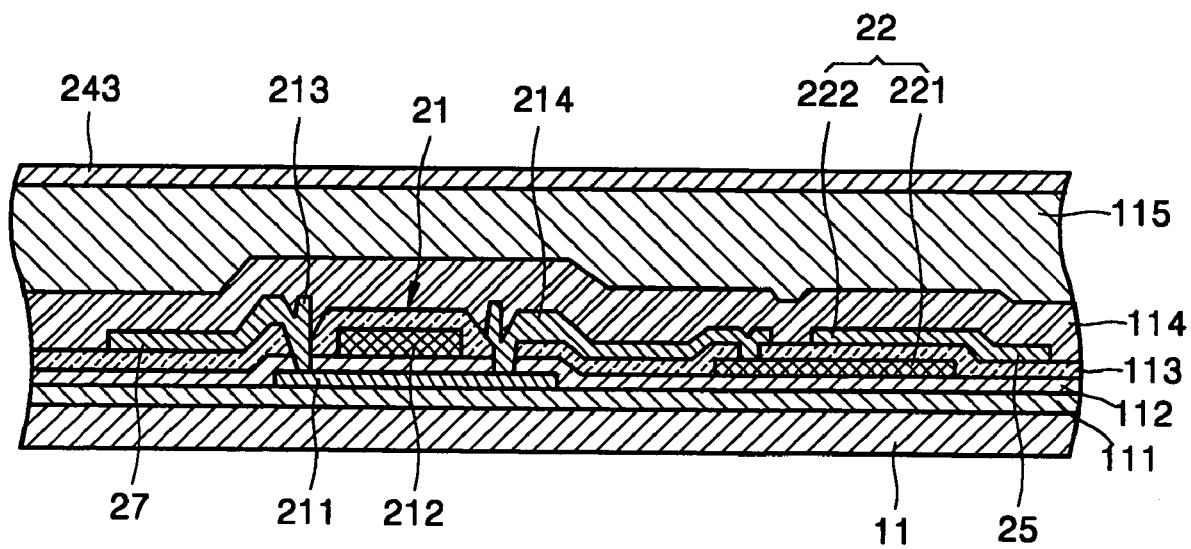
FIG. 9 is a cross-sectional view taken along line I-I of FIG. 7.
Figure 10:
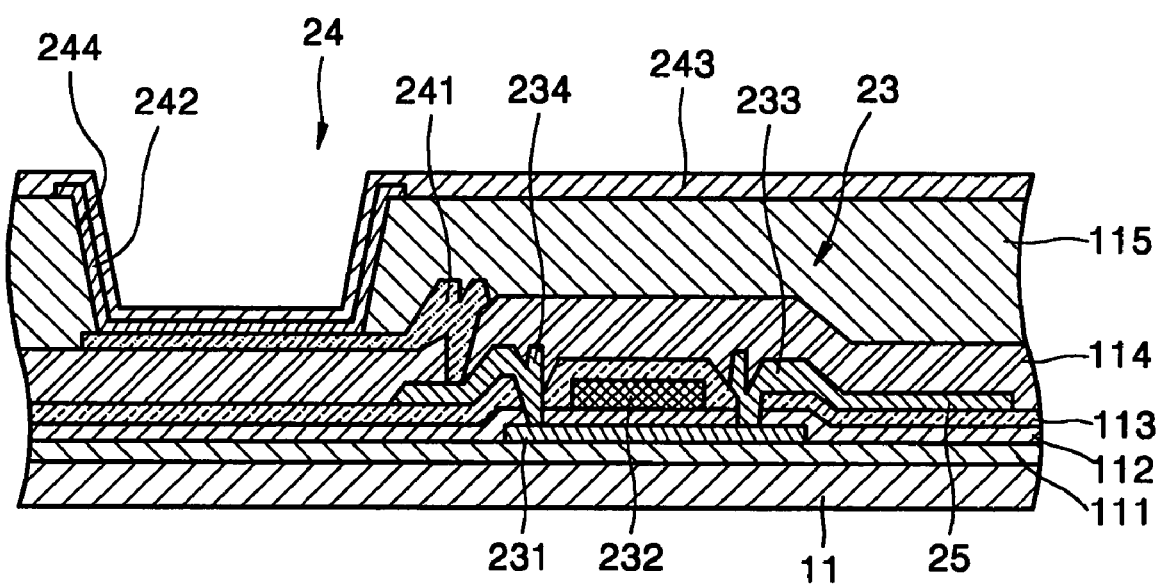
FIG. 10 is a cross-sectional view taken along line II-II of FIG. 7.

An organic EL display shown in FIGS. 7, 9, and 10 may be formed to achieve the circuit of FIG. 8. The structure of the organic EL display will now be described in detail.

As can be seen from FIGS. 7, 9, and 10, a buffer layer 111 of SiO2 is formed on a glass insulating substrate 11, and the first and second TFTs 21 and 23, the capacitor 22, and the EL display 24 are formed over the buffer layer 111.

As shown in FIGS. 7 and 9, the first TFT 21 comprises a first active layer 211 formed over the buffer layer 111, a gate insulating layer 112 formed above the first active layer 211, and a gate electrode 212 formed above the gate insulating layer 112.

The first active layer 211 may be an amorphous silicon layer, a polycrystalline silicon layer or similar material. The first active layer 211 has source and drain regions, respectively, doped with n-type or p-type impurities of a high concentration.

A gate insulating layer 112 formed of $SiO_2$ is formed above the first active layer 211, and a conductive layer formed of MoW, Al/Cu or similar material is formed in a predetermined region above the gate insulating layer 112. The gate electrode 212 is connected to the gate line 26 that transmits a TFT on/off signal.

An inter-insulating layer 113 is formed above the gate electrode 212. A source electrode 213 and a drain electrode 214 are connected to a source region and a drain region, respectively, of the first active layer 211 via contact holes. The source electrode 213 is connected to the data line 27 of FIG. 7 and supplies a data signal to the first active layer 211. The drain electrode 214 is connected to a first electrode 221 of the capacitor 22 and supplies power to the capacitor 22.

A passivation layer 114 is formed over the source and drain electrodes 213 and 214, and a planarization layer 115 is formed on the passivation layer 114. The passivation layer 114 may be formed of $SiO_2$, $SiN_x$, or similar material and the planarization layer 115 may be formed of acryl, polyimide, BCB, or similar material.

A storage capacitor 22 is coupled between the first TFT 21 and the second TFT 23 and stores the amount of driving voltage necessary to drive the second TFT 23 for a period of one frame. As seen in FIGS. 7 and 9, the capacitor 22 may comprise a first electrode 221, a second electrode 222, and the inter-insulating layer 113. The first electrode 221 is connected to the drain electrode 214 of the first TFT 21. The second electrode 222 overlaps the first electrode 221 and is electrically connected to a VDD line 25, which is a power applying line. The inter-insulating layer 113 is formed between the first and second electrodes 221 and 222, and is used as a dielectric. However, the structure of the capacitor 22 is not limited to the structure shown in FIGS. 7 and 9. For example, a silicon thin film for the TFT 21 and a conductive layer of the gate electrode 212 may be used as the first and second electrodes 221 and 222, respectively, and the gate insulating layer 112 may be used as a dielectric layer. Various other structures also may be used.

As seen in FIGS. 7 and 10, the second TFT 23 comprises a second active layer 231, a gate electrode 232, a source electrode 233, and a drain electrode 234. The second active layer 231 is formed over the buffer layer 111 and may be an amorphous silicon thin layer, a polysilicon thin layer, or similar material. The semiconductor active layer 231 has source and drain regions that are doped with n-type or p-type impurities of a high concentration. The gate electrode 232 is formed over the gate insulating layer 112, connected to the first electrode 221 of the capacitor 22, and supplies an TFT on/off signal. The source electrode 233 is located above the gate electrode 232, connected to the VDD line 25, and supplies a reference driving voltage for driving the second active layer 231. The drain electrode 234 connects the second TFT 23 and the EL display 24 to each other to supply a driving potential power and/or a source current to the EL display 24. The inter-insulating layer 113 is formed between the gate electrode 232, and each of the source and drain electrodes 233 and 234. The passivation layer 114 is formed between each of the source and drain electrodes 233 and 234 and an anode 241 of the EL display 24.

The insulating planarization layer 115 may be formed of acryl or the like and is formed above the anode 241. A predetermined opening 244 is formed in the planarization layer 115 to thereby form the EL display 24.

The EL display 24 displays predetermined image data by emitting R, G, and B light based on current flows. The EL display 24 comprises the anode 241, a cathode 243, and an organic EL film 242. The anode 241 is connected to the drain electrode 234 of the second TFT 23 and receives a positive voltage power from the drain electrode 234. The cathode 243 covers the entire body of a pixel and supplies a negative voltage power to the pixel. The organic EL film 242 is located between the anode 241 and the cathode 243 and emits light.

The anode 241 may be a transparent anode formed of ITO or similar material. If the AM-type organic EL display is a rear-emitting-type display that emits light toward the substrate 11, the cathode 243 may be deposited of Al/Ca or similar material on the entire surface of the organic EL film 242. If the AM-type organic EL display is a front-emitting-type display that emits light toward the covering member 12 facing the substrate 11, the cathode 243 may be formed of transparent material including, for example, a semipermeable thin film formed of Mg—Ag or similar material and a transparent ITO film or similar material deposited thereon. The cathode 243 may be formed in various patterns so that it is not deposited on the entire surface of the organic EL film 242. However, the present invention is not limited to the above-described positions of the anode 241 and the cathode 243, and the anode 241 and the cathode 243 may be formed alternatively to the above-described positions.

The organic EL film 242 may be a non-polymer or polymer organic film or similar material. A non-polymer organic EL film may be formed by stacking a hole injection layer (HIL), a hole transport layer (HTL), an organic emission layer (EML), an electron transport layer (ETL), and an electron injection layer (EIL) in a simple or complex structure. Various organic materials may be used, including copper phthalocyanine (CuPc), N,N'-Di (naphthalene-1-yl)-N,N'-diphenyl-benzidine (NPB), tris-8-hydroxyquinoline aluminum (Alq3), or similar materials. Non-polymer organic EL films or similar materials may be formed by vacuum deposition or by other processes.

For example, a polymer organic EL film may comprise a hole transport layer (HTL) and an emission layer (EML). The hole transport layer may be formed of PEDOT or similar materials, and the emission layer may be formed of a polymer organic material or similar material, such as a poly-phenylenevinylene (PPV)-containing material, a polyfluorene-containing material, or similar material, by screen printing or inkjet printing. The structure of the EL display 24 is not limited to the above-described structure, and various other structures also may be used.

Hereinafter, the entire structure of the organic EL display according to an exemplary embodiment of the invention will be described with reference to FIGS. 1 through 6.

Figure 2:
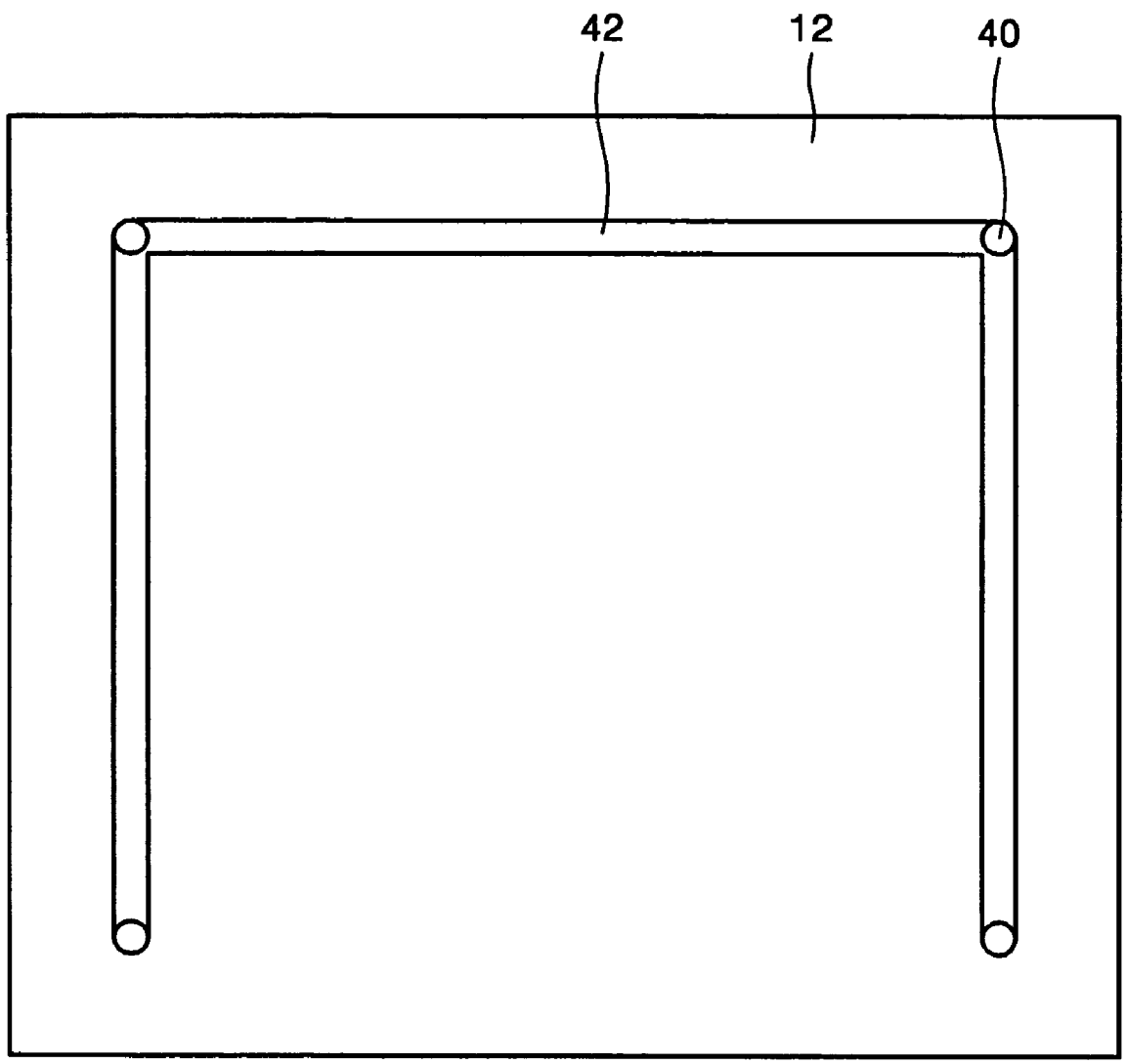
FIG. 2 is a bottom view of a covering member of the AM-type organic EL display according to an exemplary embodiment of the present invention.

FIG. 1 is a plan view of the entire structure of the AM-type organic EL display according to an exemplary embodiment of the present invention. FIG. 2 is a bottom view of a covering member 12 that is adhered to and seals the substrate 11 of FIG. 1. FIGS. 3, 4, 5 and 6 are cross-sectional views of various examples of a driving power supply line and a bus conductive unit of the AM-type organic EL display shown in FIG. 1.

The display region 2 shown in FIG. 1 comprises pixels, each of which includes the above-described organic EL display, to form an image. The TFTs, the capacitors, and the EL displays, as shown in FIGS. 7, 9, and 10, are arranged in the display region 2. The covering member 12 is located above the substrate 11, where the display region 2 is formed and adhered to the substrate 11 to protect the display region 2 from external shock, moisture, and/or air. The covering member 12 may be a glass insulating substrate, a metal cap or similar material. Various other covering members that can protect the display region 2 from outer circumstances also may be used.

The covering member 12 is adhered to the substrate 11 by a predetermined sealant, which may be applied along a sealing portion 13 illustrated with dotted lines of FIG. 1. A terminal region 3, where predetermined terminals are arranged, may be installed at the display region 2 end of the substrate 11. The terminal region 3 may be exposed outside the sealing portion 13.

A driving power supply line 41, an electrode power supply line 45, and various circuit units 51 and 52 are arranged around the display region 2. The driving power supply line 41 supplies a driving potential power and/or a source current to VDD lines 25 of the display region 2. The electrode power supply line 45 connects to the cathode 243 and supplies a cathode power to the cathode 243. The various circuit units 51 and 52 control signals applied to the display region 2.

As seen in FIG. 1, the driving power supply line 41 is connected to driving power terminals 31 to surround the entire display region 2. Further, the driving power supply line 41 is connected to the VDD lines 25 that run across the display region 2 such that the driving power supply line 41 is installed on a lower side of the substrate 11 shown in FIG. 1. Various changes may be made to the arrangement of the driving power supply line 41, according to design conditions. Although not shown in the drawings, other exemplary embodiments include, but are not limited to, the driving power supply line 41 installed on only one side of the substrate 11 or only upper and lower sides of the substrate 11 shown in FIG. 1.

The electrode power supply line 45 is installed on one side of the display region 2 and electrically connected to the cathode 243. The cathode 243 may extend to cover the electrode power supply line 45. An insulating layer may be interposed between the cathode 243 and the electrode power supply line 45 such that the cathode 243 is connected to the electrode power supply line 45 via a plurality of contact holes 451.

A vertical circuit unit 51 and a horizontal circuit unit 52 are installed between the driving power supply line 41 and the display region 2. The vertical circuit 51 may be a scan driving circuit unit which applies a scan signal to the gate line 26 of the display region 2 and is connected to a scan terminal region 33 of the terminal region 3. The horizontal circuit unit 52 may be a data driving circuit unit which applies a data signal to the data line 27 of the display region 2 and is connected to a data terminal region 34 of the terminal region 3. The vertical circuit unit 51 and the horizontal circuit unit 52 may be located inside the covering member 12 or on an external IC or COG.

The driving power supply line 41 may have an increased line resistance. In an exemplary embodiment of the present invention, in order to prevent increased line resistance in the driving power supply line 41, the AM-type organic EL display may further comprise a bus conductive unit 42 shown in FIGS. 2, 3, 4, 5 and 6.

Figure 3:
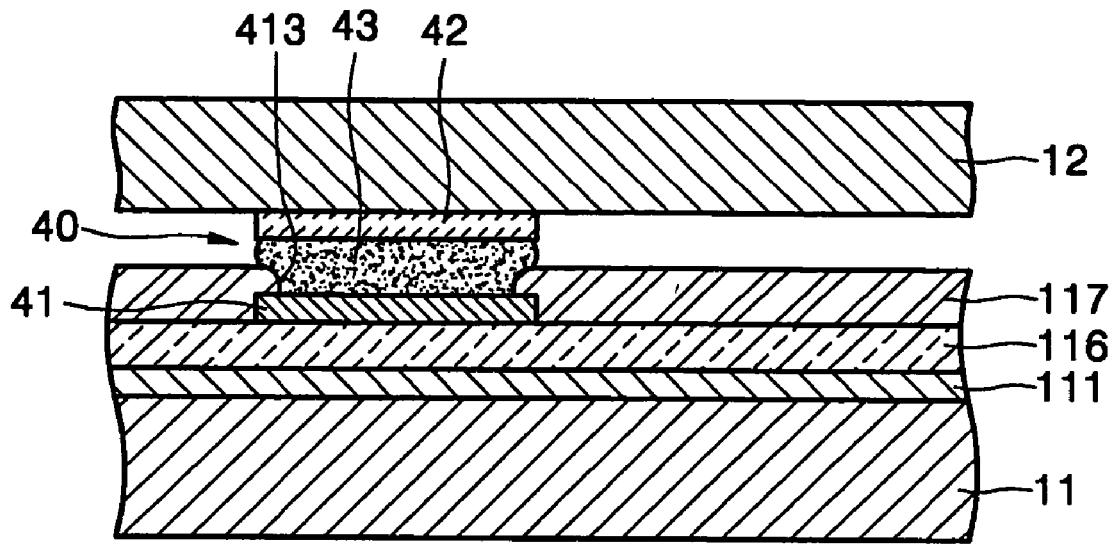
FIGS. 3, 4, 5 and 6 are cross-sectional views of various examples of a driving power supply line and a bus conductive unit of the AM-type organic EL display shown in FIG. 1.

As seen in FIG. 3, the driving power supply line 41 may be formed above the substrate 11. As described above, the buffer layer 111, a first insulating layer 116, and the driving power supply line 41 may be sequentially formed on the substrate 11. A second insulating layer 117 also may be formed to cover at least a portion of the driving power supply line 41.

Referring to FIGS. 9 and 10, the driving power supply line 41 maybe formed of the same material and patterned at the same time as the source electrodes 213 and 233 and the drain electrodes 214 and 234. The first insulating layer 116 may be the gate insulating layer 112 and/or the inter-insulating layer 113, and the second insulating layer 117 may be the passivation layer 114 and/or the planarization layer 115.

The driving power supply line 41 may be formed using various layers, such as the gate electrodes 212 and 232 and the semiconductor active layers 211 and 231. However, since the driving power supply line 41 may need to be highly conductive, the gate electrodes 212 and 232 may be selected over the semiconductor active layers 211 and 231. If the gate electrodes 212 and 232 are used as the driving power supply line 41, the first insulating layer 116 may be the gate insulating layer 112, and the second insulating layer 117 may be the inter-insulating layer 113 and/or the passivation layer 114.

The bus conductive unit 42 is electrically connected to the driving power supply line 41 and reduces the line resistance of the driving power supply line 41. The bus conductive unit 42 may be formed of a highly conductive and low resistive material and installed along the driving power supply line 41.

As shown in FIG. 1, the bus conductive unit 42 formed along the driving power supply line 41 is electrically connected to the driving power supply line 41 by one or more contact portions 40.

The contact portions 40 connect the driving power supply line 41 to the bus conductive unit 42 and may be designed by various methods. For example, as can be seen from FIG. 3, the bus conductive unit 42 may be electrically connected to the driving power supply line 41 via contact holes 413. The contact holes 413 may be formed at the second insulating layer 117, which covers the driving power supply line 41. Other methods may also be used.

As can be seen from FIG. 2, the bus conductive unit 42 may be formed on the bottom of the covering member 12 to face the substrate 11. Thus, as the covering member 12 is adhered to the substrate 11, the bus conductive unit 42 may be electrically connected to the driving power supply line 41. To adhere the covering member 12 to the substrate 11, a conductive paste 43 is applied between the bus conductive unit 42 and the driving power supply line 41 near the contact holes 413 to electrically couple the bus conductive unit 42 to the driving power supply line 41. As an illustrative example, the conductive paste 43 may be a silver paste or similar material and functions as an adhesive.

Figure 4:
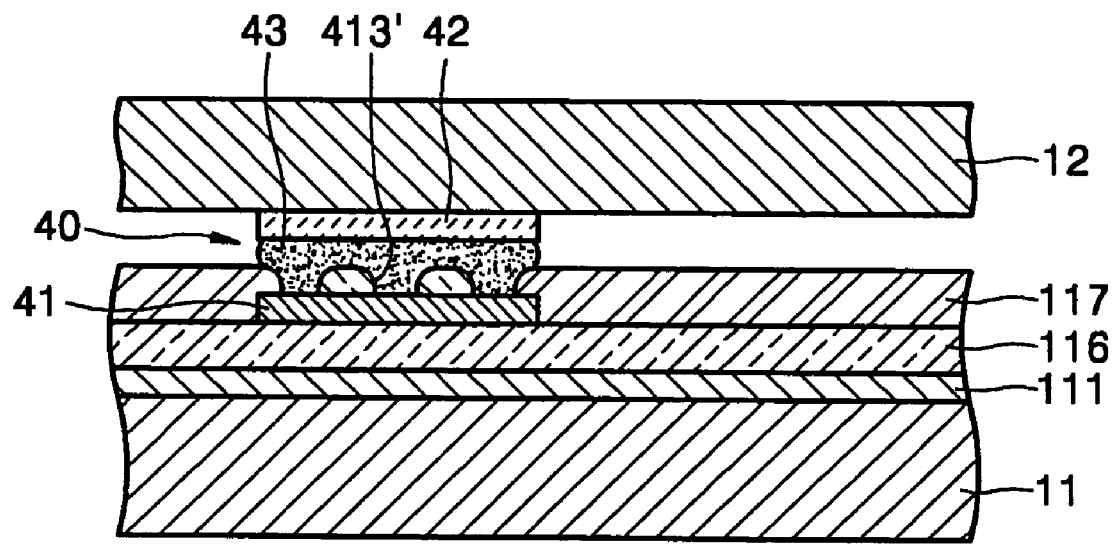

The contact holes 413 of the contact portions 40, which enable the bus conductive unit 42 to contact the driving power supply line 41, may be formed to be sufficient, as shown in FIG. 3, to reduce the contact resistance. However, the present invention is not limited thereto, and a plurality of narrow contact holes 413' may be formed instead, as illustrated in FIG. 4.

Figure 5:
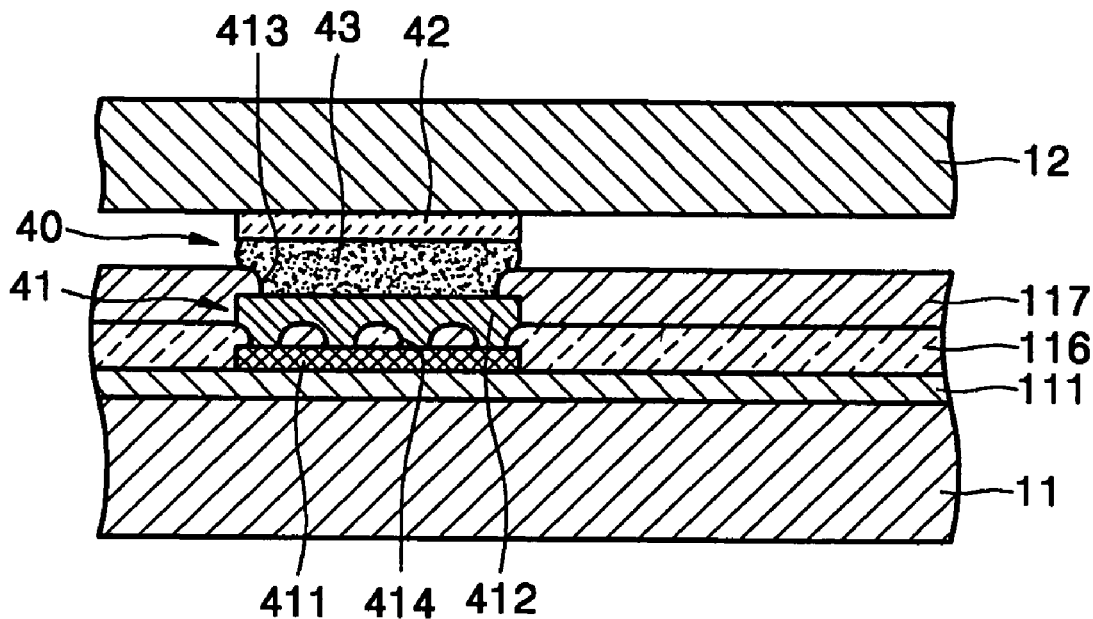

The driving power supply line 41 may be made of an insulating layer interposed between at least two conductive layers. As seen in FIG. 5, a first conductive layer 411 is formed on a buffer layer 111, and a first insulating layer 116 is formed on the resultant structure to cover the first conductive layer 411. One or more contact holes 414 are formed in the first insulating layer 116, and a second conductive layer 412 is formed on the contact holes 414. A second insulating layer 117 is formed above the second conductive layer 412, and contact holes 413 are formed in the second insulating layer 117. The driving power supply line 41 is electrically connected to the bus conductive unit 42 via a conductive paste 43. The first conductive layer 411 may be formed of the same material as the gate electrodes 212 and 232, and the second conductive layer 412 may be formed of the same material as the source and drain electrodes 213, 233, 214, and 234. However, the present invention is not limited thereto. The driving power supply line 41, comprised of two or more conductive layers such as 411 and 412, may reduce the line resistance.

As described above, the bus conductive unit 42 is formed on the covering member 12. As the covering member 12 is adhered to the substrate 11, the bus conductive unit 42 may be electrically connected to the driving power supply line 41. By forming the bus conductive unit 42 on the covering member 12, the bus conductive unit 42 may be formed after the organic EL film 242 is patterned. Since the organic EL film 242 may be vulnerable to moisture, it may be difficult to form patterns after forming the organic EL film 242. However, in an exemplary embodiment of the present invention, because the bus conductive unit 42 is formed on the covering member 12, the substrate 11 may not need to be patterned again, where the organic EL film 242 is formed, to form the bus conductive unit 42. However, the present invention is not limited to the above-described structure of the bus conductive unit 42.

Figure 6:
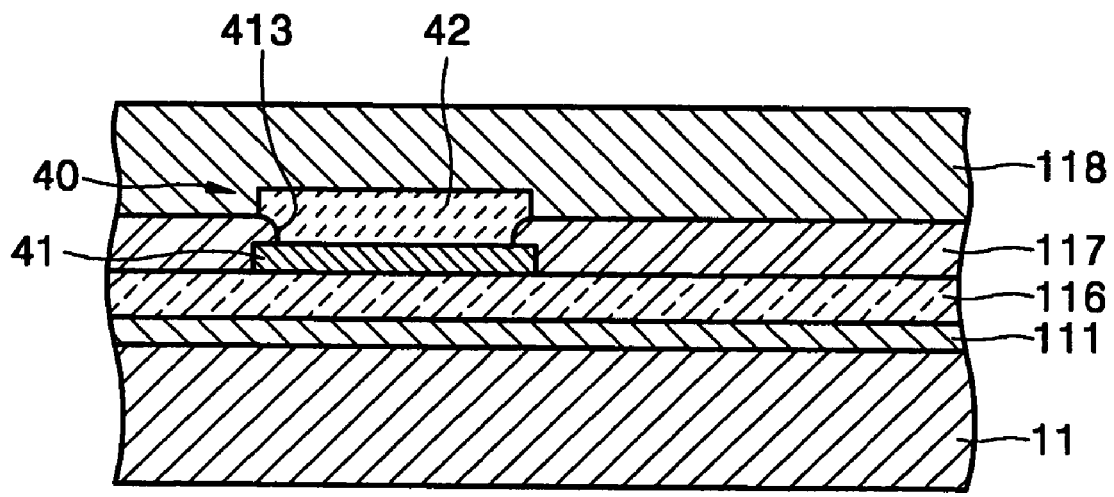

As seen in FIG. 6, the bus conductive unit 42 may be formed directly on the driving power supply line 41 that is exposed via the contact holes 413. A third insulating layer 118 may cover the bus conductive unit 42. The third insulating layer 118 may be a planarization layer, but the present invention is not limited thereto.

The driving power supply line 41 may be a single layer that is formed of the same material as the source and drain electrodes 213, 233, 214, and 234 and/or the gate electrodes 212 and 232, as described with reference to FIGS. 3 and 4, or may be made up of two or more conductive layers, as described with reference to FIG. 5. As seen in FIGS. 9 and 10, the bus conductive unit 42 also may be formed of the same material as the anode 241. As illustrated in FIGS. 9 and 10, the bus conductive unit 42 may be formed of the same material as the cathode 241.

In an exemplary embodiment of the present invention, even if the installed driving power supply line 41 is lengthy, the bus conductive unit 42 may reduce the line resistance to thereby minimize power dissipation.

A flat panel display according to the present invention as described above may have the following effects.

A bus conductive unit may be formed at a driving power supply line to reduce the line resistance of the driving power supply line, thereby reducing a voltage drop in the driving power supply line.

Because of the bus conductive unit, a more uniform resolution and an improved level of luminance may be obtained.

Since the bus conductive unit may be formed on a covering member, the entire manufacture may be simple and the bus conductive unit may be more easily formed after an organic EL film is deposited.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flat panel display, comprising:
a substrate;
a display region formed on the substrate, the display region having a self-luminescent element and power applying lines configured to supply a current to the self-luminescent element;
a covering member for sealing at least the display region, the covering member being adhered to the substrate to face the substrate;
a terminal region formed on one or more edges of the substrate, the terminal region having one or more driving power terminals;
a driving power supply line connecting the driving power terminals to the power applying lines of the display region; and
a bus conductive unit that is electrically connected to the driving power supply line by one or more contact portions,
wherein the contact portions include one or more contact holes, where each of the one or more contact portions is formed in an insulating layer located on top of the driving power supply line, and the driving power supply line is electrically connected to the bus conductive unit via the contact holes.

2. The flat panel display of claim 1, wherein the driving power supply line is electronically connected to the bus conductive unit by a conductive paste that is applied to the contact holes.

3. A flat panel display, comprising:
a substrate;
a display region formed on the substrate, the display region having a self-luminescent element and power applying lines configured to supply a current to the self-luminescent element;
a covering member for sealing at least the display region, the covering member being adhered to the substrate to face the substrate;
a terminal region formed on one or more edges of the substrate, the terminal region having one or more driving power terminals;
a driving power supply line connecting the driving power terminals to the power applying lines of the display region; and
a bus conductive unit that is electrically connected to the driving power supply line by one or more contact portions,
wherein the bus conductive unit is formed on a surface of the covering member that faces the substrate,
wherein the contact portions include one or more contact holes, where each of the one or more contact portions is formed in an insulating layer located on top of the driving power supply line and exposes a portion of the driving power supply line, and the driving power supply line is electrically connected to the bus conductive unit via the contact holes.

4. The flat panel display of claim 3, wherein the driving power supply line is electrically coupled to the bus conductive unit by a conductive paste that is applied to the contact holes.

* * * * *